United States Patent [19]

Rodriguez et al.

[11] 4,053,864
[45] Oct. 11, 1977

[54] THERMISTOR WITH LEADS AND METHOD OF MAKING

[75] Inventors: George H. Rodriguez, Williamstown; John P. Maher, Adams, both of Mass.

[73] Assignee: Sprague Electric Company, North Adams, Mass.

[21] Appl. No.: 752,584

[22] Filed: Dec. 20, 1976

[51] Int. Cl.² .............................................. H01C 7/02
[52] U.S. Cl. .................... 338/22 SD; 29/612; 29/621; 65/59 R; 252/512; 338/322; 338/327; 357/65; 357/67; 428/328; 428/411; 428/471
[58] Field of Search ............... 338/22 R, 23, 22 SD, 338/25, 322, 327; 29/612, 621; 357/65, 67; 339/DIG. 3; 252/512; 65/59 R, 59 B; 428/328, 411, 471; 106/47 B, 47 R

[56] References Cited

U.S. PATENT DOCUMENTS

| | | | |
|---|---|---|---|
| 2,752,663 | 7/1956 | White et al. | 29/625 |
| 3,019,198 | 1/1962 | Dumesnil | 338/22 |
| 3,231,522 | 1/1966 | Blodgett et al. | 338/22 X |
| 3,310,718 | 3/1967 | Lupfer | 338/322 X |
| 3,457,539 | 7/1969 | Lupfer | 338/322 |
| 3,547,835 | 12/1970 | Short | 338/22 SD |
| 3,676,211 | 7/1972 | Kourtesis et al. | 29/589 X |
| 3,808,046 | 4/1974 | Davey | 252/512 X |

*Primary Examiner*—C. L. Albritton
*Attorney, Agent, or Firm*—Connolly and Hutz

[57] ABSTRACT

A PTCR thermistor has a doped barium titanate body, and two base metal lead wires being bonded to and ohmically connected to two separate surface regions of the body by means of two conductive electrodes, respectively. The electrodes are comprised of aluminum particles being bound within a matrix of a lead borate glass. The glass amounts to from 20 to 60% by weight. The simple method of making the thermistor may include the selective application of heat to the electrode regions to avoid oxidizing the base metal leads. These thermistors are capable of undergoing many self-heating switching operations in service without deterioration of the lead to body connections.

14 Claims, 4 Drawing Figures

THERMISTOR WITH LEADS AND METHOD OF MAKING

BACKGROUND OF THE INVENTION

This invention relates to semiconducting titanate ceramic thermistors and more particularly to such thermistors having fatigue resistant joints between the thermistor body and the leads.

Semiconducting ceramic thermistors typically have a positive temperature coefficient of resistance (PTCR) and a distinct temperature threshold at which the resistance of the thermistor changes several orders of magnitude. Such thermistors are usually employed in a self heating switching mode to control circuit currents as in a motor start control circuit. Thus the PTCR thermistor typically experiences a rapid change in temperature during each cycle of circuit operation wherein a temperature change of around 100° C commonly occurs in a fraction of a second. Such thermistors often include two electrodes being bonded to separate regions of the ceramic body with a lead wire or other terminal means being attached to each electrode.

Electroding metals that have been found suitable for making low resistance ohmic contact with the semiconducting thermistor body have generally been limited to such metals as nickel and aluminum. A base film or layer of these contacting metals is usually coated with a highly solderable silver containing over layer. Lead wires are then attached to the electrodes by soldering. Troublesome and difficult to deposit high temperature solders are often necessary since thermistors are typically required to operate at temperatures from 140° to 200° C Alternatively, lead wires are attached to the base layer of ohmically contacting electrode metal by means of a silver loaded resin that is subsequently heat cured. It is also known to employ an electroding paste containing a large quantity of silver particles, a small quantity of aluminum particles and a glass frit. The silver reduces the resistivity of the electrodes which may be advantageous when using thin film electrodes. However, such silver bearing electrodes thicker than about 0.001 inch (0.0025 cm) are not practical at all for most purposes because they are too costly.

Another alternative is to provide spring loaded metal plate terminations against each contacting electrode film as is described in the U.S. Pat. No. 2,835,434 issued Sept. 10, 1974 and 3,914,727 issued Oct. 21, 1975, both of which are assigned to the same assignee as in the instant invention.

Conventional electroding and associated lead soldering methods consist of a plurality of manufacturing steps that are rather complex. But of greater significance is the fact that thermistors having soldered leads are capable of being cycled no more than about 10,000 times before the solder joint becomes fatigued, presents a higher and higher ohmic resistance and ultimately fails physically. Thermistors with resin-silver bonded leads exhibit a similar lead joint fatigue failure. Thermistors having spring loaded plate terminations do not exhibit such a terminal fatigue mode and have longer lives by orders of magnitude. However, the latter represents more complex package designs and tends to be more costly.

It is therefore an object of the present invention to provide a simple leaded PTCR thermistor having a long useful life.

It is a further object of the present invention to provide a simple method for making a leaded PTCR thermistor.

It is a further object of this invention to provide a low cost PTCR thermistor having substantially silver free electrodes.

It is a further object of this invention to provide a simple PTCR thermistor capable of more than 10,000 self-heating switching cycles without failure.

SUMMARY OF THE INVENTION

A thermistor having a fatigue resistant joint between the body and at least one of the leads comprises a titanate ceramic PTCR body, an electrode being bonded to and making ohmic contact with a surface region thereof, and a base metal lead. The base metal lead has a portion that is completely embedded within and bonded by the electrode. The electrode is comprised of aluminum particles bound by a matrix of a lead-aluminoborate glass.

The oxide film surfaces of the aluminum particles tend to go into solution and become a part of the molten glass during firing. It is known that aluminum acquires an oxide film of about 100 angstroms thickness at room temperature which grows to about 2000 angstroms when exposed to 500° C in air.

This invention recognizes the principle that when firing a mixture of glass and aluminum in air, the alumina film surfaces of the aluminum will diffuse more slowly into the glass and the glass becomes more viscous as the alumina approaches the saturation point in the glass. Accordingly, the highly conductive PTCR electrode of this invention has a high ratio of glass to aluminum and contains relatively large essentially oxide free aluminum particles having a small surface area to particle weight. Thus the electrode of this invention contains from 20% to 60% glass by weight and the size of the aluminum particles is no less than 5 microns. Also for the same reason, it is preferred to use essentially spherical aluminum particles, as opposed to flake shaped particles, to minimize the particle surface to weight ratio.

The glass-aluminum electrode serves the threefold purpose of making ohmic contact to the semiconducting body, making electrical contact to the base metal lead wire and physically bonding the lead wire to the PTCR titanate ceramic body. A major advantage of this construction is its ability to survive at least 10,000 and in some cases over 300,000 self-heating switching cycles without electrical or physical degradation. The relatively rigid glass-aluminum electrode is surprisingly superior in this respect to the system including a malleable solder that is conventionally employed to bond a lead wire to an electroded titanate thermistor body. This is true even for the PTCR of this invention wherein the glass-aluminum paste consists of a thick deposit entirely burying the end of a base metal lead of different thermal coefficient of expansion compared to that of the glass. For example, the glass compositions employed have a linear thermal coefficient of expansion of about 6 to $10 \times 10^{-6}/°$ C while that of copper and nickel is $16.6 \times 10^{-6}/°$ C and $13 \times 10^{-6}/°$ C, respectively, which base metals may be used as the lead wires in the PTCR thermistor of this invention.

A further advantage of this thermistor is the relatively simple process by which it is made. The method comprises positioning a portion of each of two base metal leads adjacent to one and the other of two separate surface regions of the thermistor body, applying to the lead portions and to the two separate surface regions of the body a coating of an electroding paste that includes aluminum particles, a lead borate glass powder and an organic vehicle, and heating the electroding paste at a temperature from 660° to 850° C to melt the glass and to achieve the desired bonds between the lead wires, the electroding composition and the body. Furthermore, the heat may be selectively directed to the region of the electrodes in order to avoid substantial heating and oxidizing of the extending portions of the base metal leads. Thus they need not be cleaned prior to being connected into a circuit. Alternatively the base metal leads may be silver plated.

Bare nickel leads are particularly well suited and are preferred for use in the thermistor of this invention since nickel is solderable, and is relatively oxidation resistant so that a minimum of care is required to direct the heat away from their extended portions. Furthermore, in comparison with copper, nickel has a greater physical strength and a lower thermal conductivity. Thus for applications requiring good thermal isolation from the environment of the thermistor, nickel leads may advantageously be made of a fine gauge wire and yet equal the strength of a larger copper wire while providing a much lower thermal coupling between the thermistor body and the system terminals to which its leads are attached.

The lead-borate glass powder of this invention contains no more than about 40 percent silica ($SiO_2$) by weight because such silica rich formulations are too viscous to mature at or below about 800°–850° C. However, the addition of at least 10% silica is preferred since it increases the strength of the glass and gives it a greater chemical durability. In general lead-borosilicate glasses with more than about 95% lead oxide (PbO) have a melting temperature of greater than about 800°–850° C and are unsuitable. The glass compositions having more than 40% boron oxide ($B_2O_3$) are disintegrated by water and are unsuitable for use in thermistors since they may be exposed to humid atmospheres at elevated temperatures. Small quantities of alumina ($Al_2O_3$) up to about 5% may be incorporated in the glass powder, but larger quantities tend to retard the desired incorporation by the glass of the oxide ($Al_2O_3$) from the surface of the aluminum particles during firing, which incorporation is essential to provide a low resistivity electrode. Thus in general, the glass powder consists by weight of 23–95% PbO, 5–40% $B_2O_3$, 0–40 $SiO_2$, and 0–5% $Al_2O_3$. It should be understood the other commonly employed glass constituents such as the oxides of zinc, bismuth, cadmium and the alkaline earth metals may also be included, provided the melting point of the glass is less than the firing temperature. If the starting glass composition contains no alumina and amounts to 60% of the electrode, the glass of the fired electrode will contain at least about 0.2 wt.% of alumina that will have been acquired from the surfaces of the aluminum particles.

DESCRIPTION OF THE PREFERRED EMBODIMENTS

Figure 1:
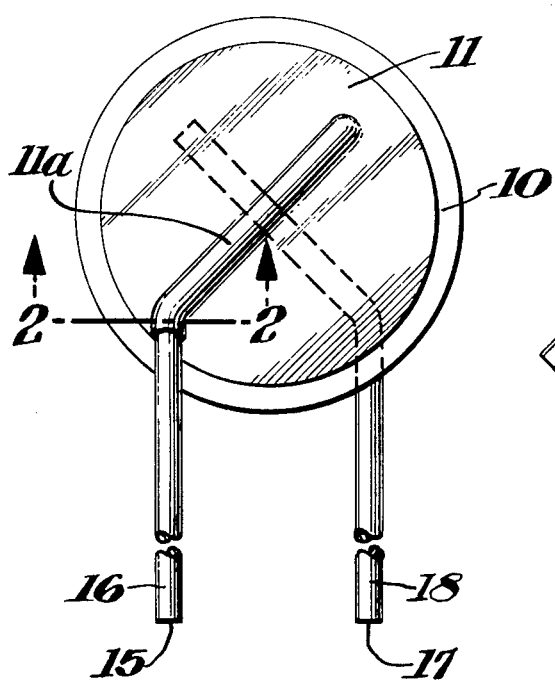
FIG. 1 shows in side view a first preferred thermistor embodiment of this invention.

A number of experimental electroding pastes were made to determine the suitability of varying amounts of glass to aluminum for use in the PTCR electrode of this invention. The glass formulation was 66 PbO, 23 $SiO_2$, 8.4 $B_2O_3$ and 2.6 $Al_2O_3$ in parts by weight. The aluminum powder consisted of spherical particles having an average size of about 8 microns. The solid powders were mixed in an organic vehicle and binder. The paste was deposited by screening onto a PTCR titanate ceramic body. The amount of glass was varied while adjusting the vehicle to maintain the same viscosity for screening. The screened electrodes were fired at 843° C for ½ hour.

In Table I below, the sheet resistivity ($\Omega/\square$) range for the electrodes are shown for each paste composition. The percent glass is given by weight relative to the total solids in the electrode, namely the weight of glass plus that of the aluminum.

TABLE I

| % WEIGHT OF GLASS IN ELECTRODE | | | | | |
|---|---|---|---|---|---|
| 20% | 30% | 40% | 50% | 60% | 70% |
| ($\Omega/\square$) .08–.47 | .08–.09 | .06–0.16 | 6.5–1K | 81–1.9K | 81–4.1M |

It is seen that electrodes having less than about 20% glass tend to have increasing resistivities. However, the series resistance of the electroded bodies was also measured from electrode to electrode through the body within 2 hours after initial cooling to room temperature. All of the experimental units exhibited an increase in resistance of on the order of 10% which is attributed to normal changes in the titanate body. But after 2 days one unit having 20% glass in the electrode became open circuited. This is attributed to inferior bonding of the electrode to the PTCR body for the electrodes having the low glass content.

Although the resistivities of electrodes having the 60% glass tend to become high in screened film form, they will be suitable in thick electrodes and/or for PTCR bodies having a high resistance at room temperature. The higher glass content electrodes are also stronger. Thus it is preferred that the PTCR electrode of this invention contain from 20% to 60% glass by weight.

In an electrode of this invention having large aluminum particles of 20 microns average size, and the composition being 60% glass to 40% aluminum by weight, it has been estimated assuming a growth of 1000 angstroms ($Al_2O_3$) films on the aluminum particle surfaces that an alumina free glass will upon reacting with all this alumina ultimately contain 2% by weight alumina. Similarly for a 20% glass to 80% aluminum electrode having 5 micron aluminum particles, the glass will ultimately contain 26% by weight alumina.

An experimental determination was made of the maximum amount of alumina that could be reacted with and incorporated in the above described glass over a half hour at two temperatures. The glass would take on and contain a maximum of 12% alumina by weight at 660° C, 19 ½% alumina at 760° C which may be extrapolated to about 25% alumina at 850° C.

Although the assumed 1000 angstrom alumina film thickness may in fact be more or less at different firing temperatures, it is clear that for a given temperature there is a minimum aluminum particle size below which an electrode of a given composition will be expected to exhibit a higher resistivity. From this data and the experiments employing 8 microns aluminum above, it is judged that this minimum limit is about 5 microns for an electrode having 20% glass and 80% aluminum. It is thus concluded that although smaller aluminum particles may be used under certain circumstances, the use of 5 micron or larger particles generally provides at least an improved electrode with higher conductivity, all else being equal.

Other tests were made to determine the effect of varying the size of the aluminum particles in the electrode. The particle sizes were determined by a standard Fischer sub-sieve-size analyzer.

A series of thixotropic pastes having different kind of aluminum powder were made using 35% of the above described glass. A thick strip of the paste of each kind was applied by spatula to a PTCR titanate ceramic body and fired to produce electrode strips that were about 0.1 inches ( 0.25 cm) thick. Some of the thick electrodes curled and peeled away from the PTCR body after firing due to residual stresses in the electrode and inferior adhesion of the electrode to the body.

In one electrode of this series, using aluminum flake having an average size of 1 micron, adhesion was adequate but at the 843° C firing temperature employed in the other tests of the series, resistivity was very high. However, a very narrow firing range of about 50° C centered at 730° C was found which did provide an adequately low resistivity. Electrodes with larger particles are more tolerant of firing temperature, which may be attributed to the corresponding smaller aluminum surface area to aluminum weight ratio and the capacity of the glass to react with the correspondingly smaller amount of alumina generated over a wide range of temperatures.

Using aluminum powders having average particle sizes 16, 18 and 20 microns respectively, it was observed that the electrodes having the largest particles were peeled away from the body most readily and were least adherent, while those having an average diameter of 16 microns aluminum particles marginally passed this test. As will be elaborated in a second preferred embodiment of the PTCR of this invention, the 16 micron aluminum electrode provided excellent results without failures over a large quantity of experimental units. It is concluded that the thick strip adhesion test is too severe. The average aluminum particle size may be at least as great as 20 microns and possibly larger for use in this invention.

Figure 2:
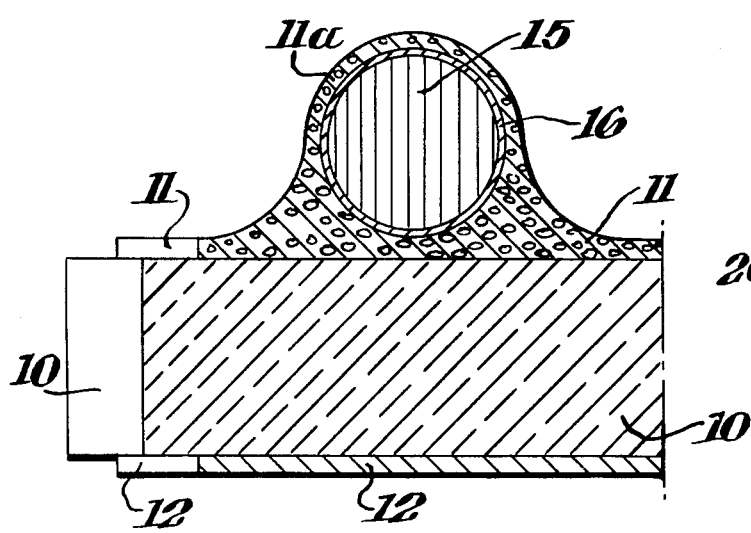
FIG. 2 shows in an end sectional view the thermistor of FIG. 1.

Referring to FIGS. 1 and 2, a PTCR semiconducting titanate ceramic body 10 has the form of a disc. Two electrode films 11 and 12 are directly bonded to and are in ohmic contact with the two opposite major faces, respectively, of the disc 10. Two nickel leads 15 and 17 having on their surfaces silver films 16 and 18, respectively, are in direct bonded contact with the two electrodes 11 and 12, respectively, and are thereby electrically and physically attached to the opposite major faces of the semiconducting titanate disc 10.

Experimental units of the type shown in FIGS. 1 and 2 were made using a conventional PTCR body consisting of a doped barium titanate. The major dopant was niobium pentoxide in the amount of about 2000 parts per million. The diameter of the body was 1.25 inch (3.2 cm.) while the thickness was 0.2 inch (0.5 cm.).

A paste was prepared by mixing 650 grams spherical aluminum particles with 350 grams of a glass powder in an organic binder and vehicle. The average aluminum particle size was about 8 microns. The same lead borate glass described above was used. The organic vehicle consisted of 150 grams of terpineol, 12 grams of ethylcellulose serving as a binder. Subsequently 80 grams of terpineol was added to achieve a suitable viscosity for screen printing.

Films 11 and 12 were screen printed using a 150 mesh screen onto the opposite major surfaces of the body 10. These units were then fired at 760° C, holding at this peak temperature for about 6 minutes to drive off the vehicle and to burn off the residual organic materials. Total firing time was 1 hour.

The two silver plated nickel lead wires 15 and 17 were then placed with an end of each in contact with the fired glass-aluminum films 11 and 12, respectively. A small quantity of the above-described paste minus the added terpineol was applied over the lead wires 15 and 17 at the end portions contacting the electrode films 11 and 12. Using a tunnel-belt kiln, the units were again subjected to a temperature of 760° C for 6 minutes. The lead wire end portions were thus completely embedded in the composite glass-aluminum electrodes.

Another group of experimental units employed smaller PTCR bodies having a diameter of 0.1 inch (0.25 cm.) and a thickness of 0.08 inch (0.20 cm.), but otherwise as constructed in the same way using the same materials as those of the first described units.

The peel strength of these lead wires, according to a widely employed test, was adequate and commensurate with that of conventional units having leads soldered to glass-silver electrodes. However, when the experimental units were operated in a self heating switching mode for over 300,000 cycles there was still no degradation of the physical or electrical properties while the conventional units all failed at about 10,000 cycles in the same test. The failures were characterized by high series resistance and cracking of the solder about the leads.

Figure 3:
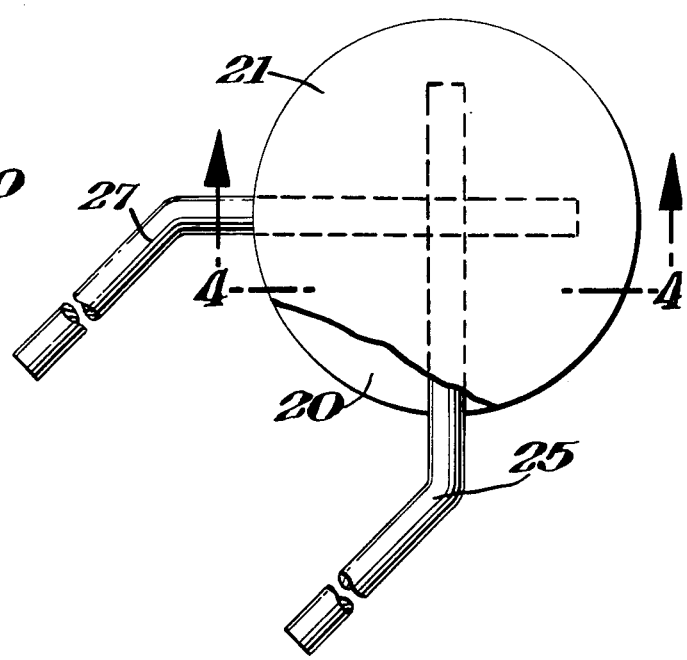
FIG. 3 shows in side view a second preferred thermistor embodiment of the invention.
Figure 4:
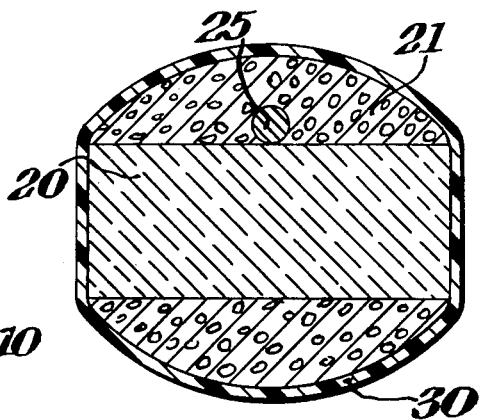
FIG. 4 shows in an end sectional view the thermistor of FIG. 4 having in addition a protective insulative coating.

Another set of experimental units were made using PTCR body 20 as illustrated in FIGS. 3 and 4. The body 20 was of the same composition as those used in the above-described experiments. Its diameter was 0.1 inch (0.25 cm.) and the thickness was 0.08 inch (0.20 cm.). A paste was prepared using spherical aluminum particles of 16 micron average size and the same glass and binder-vehicle system described immediately above, but the weight of the glass was increased to equal that of the aluminum. Two nickel lead wires 25 and 27 were each positioned with one end portion contacting one and the other opposite major surfaces of the body 20. A small quantity of the relatively high viscosity paste was dispensed over these contacting ends of the lead wires. A thick highly crowned electrode layer 21 was formed on the top surface of disc 20 as shown in FIG. 4, completely covering an end portion of lead wire 25.

Fifty of these thermistor subassemblies were mounted regularly spaced side by side, having the extended portions of their lead wires bound between two strips of cardboard. Stainless steel plates were clamped on either side of the cardboard strips so that the heat of the furnace was shielded away from the cardboard and extended lead portions. It is possible to substitute two heat sinking metal plates for the two cardboard strips toward maintaining the extended lead portions at an even lower temperature.

These units were fired at 750° C, holding at this peak temperature for 2 minutes, causing the paste to flow over and to the edges of the major surfaces of the body 20. The paste was prevented from flowing beyond these edges by surface tension effects at the edges. The lead wire was 0.020 inch (0.051 cm.) in diameter and the fired electrodes had a thickness over the wire ends of about 0.05 inch (0.13 cm.). This resulted in an overall unit height of 0.220 inch (0.559 cm.) on the average.

The bond strength of these leads to the body was even greater in peel than those of the first described experimental units being on the average over 1000 pounds per square inch. Eight of the thermistors along with eight conventional control units were subjected to a long series of self-heating switching cycles. A 10 second pulse of 150 volts was applied during each 90 seconds cycle period. Each of the control units employed a body of the same PTCR ceramic material as for the eight experimental units, but used a first electrode layer of aluminum, a second electrode layer of silver and copper leads that were solder attached using 60Pb/40Sn solder. After 14,000 cycles all the control units had failed due to solder fatigue, the first failure being noted at 6000 cycles. At 14,000 cycles the first of the eight experimental thermistors of this invention failed.

Bare iron, nickel and copper and alloys thereof are also suitable as lead wires in PTCR components of this invention. However, iron and copper especially tend to oxidize at their bare extended portions making it necessary to clean them prior to soldering them into electronic equipment. This is also a problem using bare nickel wire although to a lesser degree.

In another method for selectively heating, a blast of hot air may be selectively directed at the body with or without heat shields over the leads. Selective radiant heat is also feasible.

When the leads for a plurality of units are held between two cardboard strips, using standard carded lead wire assemblies, after firing, a plurality of leaded PTCR units are advantageously held in regular registration with each other, making possible the automatic handling and testing of the individual PTCR units prior to being separated from the cardboard and from each other, as well as permitting a gang dip or spray coating using a protective coating such as an epoxy. Such a protective coating 30 is illustrated in FIG. 4. The selective heating step above mentioned thus has the additional advantage of permitting the use of carded leads that serve a continuing organizing and registration function through the firing step without burning to the final steps of encapsulating, testing and marking.

What is claimed is:

1. A thermistor having a fatigue resistant lead joint comprising a PTCR titanate ceramic body; at least one electrode being bonded to and making ohmic contact with one surface region of said body; a base-metal lead having a portion thereof being bonded by and completely embedded within said one electrode; and another electrode being in contact with another surface region of said body, said one electrode being comprised of aluminum particles that are bound by a matrix of a lead-aluminoborate glass, said glass amounting to from 20 to 60% by weight of the sum of said glass and said aluminum.

2. The thermistor of claim 1 wherein said aluminum particles are spherical.

3. The thermistor of claim 1 wherein said aluminum particles have an average diameter of at least 5 microns.

4. The thermistor of claim 1 wherein said glass consists by weight of from 75 to 99.8% of a first group of oxides comprising 23 – 95% PbO 5–40% $B_2O_3$, and 0 – 40% $SiO_2$; and from 0.2 to 25% alumina.

5. The thermistor of claim 1 wherein said glass contains at least 10% $SiO_2$ by weight.

6. The thermistor of claim 1 wherein said base metal of said leads is selected from iron, copper, nickel and alloys thereof.

7. The thermistor of claim 1 wherein said base metal leads are silver plated.

8. A method for making a thermistor having a fatigue resistant lead joint comprising positioning a portion of a base metal lead adjacent to a surface region of a PTCR titanate body; dispensing an electroding paste over said lead portion and said adjacent surface region of said body, said electroding paste comprising a mixture of a lead-borate glass powder, aluminum particles and an organic vehicle, and said glass amounting to from 20% to 60% by weight of the sum of said glass and said aluminum; and heating said dispensed electroding paste to melt said glass and to ohmically and physically attach said lead to said semiconducting body.

9. The method of claim 8 wherein said aluminum particles are spherical.

10. The method of claim 8 wherein said aluminum particles have an average diameter of at least 5 microns.

11. The method of claim 8 wherein said heating is accomplished at a temperature from 660° to 850° C.

12. The method of claim 8 wherein said heating is accomplished by selectively directing said heat to the region of said electrode in order to avoid substantial heating and oxidizing of the extending portions of said base metal leads.

13. The method of claim 8 additionally comprising forming a film of said electroding paste on said surface region of said body and firing said film, said positioning being accomplished by placing said portion of said lead in contact with said fired film, prior to said dispensing.

14. The method of claim 8 wherein said glass contains by weight
23 – 95% PbO
5 – 40% $B_2O_3$
0 – 40% $SiO_2$
0 – 5% $Al_2O_3$.

* * * * *

UNITED STATES PATENT OFFICE
CERTIFICATE OF CORRECTION

Patent No. 4,053,864                    Dated  October 11, 1977

Inventor(s)  George H. Rodriguez et al

It is certified that error appears in the above-identified patent and that said Letters Patent are hereby corrected as shown below:

Column 1, line 62, after "fatigue" insert -- failure --

Column 3, line 37, delete "of"

Column 3, line 50, "the" should read -- that --

Column 3, line 68, "the" should read -- this --

Column 5, line 17, "kind" should read -- kinds --

Column 6, line 29, "as" should read -- was --

Column 7, line 37, "heat" should read -- heating --

Signed and Sealed this

Seventh Day of February 1978

[SEAL]

*Attest:*

RUTH C. MASON
*Attesting Officer*

LUTRELLE F. PARKER
*Acting Commissioner of Patents and Trademarks*